United States Patent
Chen et al.

(10) Patent No.: US 9,318,381 B2
(45) Date of Patent: Apr. 19, 2016

(54) METHOD OF FABRICATING CONDUCTIVE LINE OF A SEMICONDUCTOR DEVICE

(71) Applicant: UNITED MICROELECTRONICS CORP., Hsin-Chu (TW)

(72) Inventors: Mu-Chin Chen, Taichung (TW); Yuan-Sheng Chiang, Hsinchu (TW); Chi-Sheng Hsiung, Taichung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/788,813

(22) Filed: Jul. 1, 2015

(65) Prior Publication Data

US 2015/0303104 A1  Oct. 22, 2015

Related U.S. Application Data

(62) Division of application No. 13/570,237, filed on Aug. 8, 2012, now Pat. No. 9,117,820.

(51) Int. Cl.
| | |
|---|---|
| *H01L 21/768* | (2006.01) |
| *H01L 23/528* | (2006.01) |
| *H01L 23/532* | (2006.01) |
| *H01L 21/3213* | (2006.01) |

(52) U.S. Cl.
CPC .... *H01L 21/76877* (2013.01); *H01L 21/32139* (2013.01); *H01L 21/76843* (2013.01); *H01L 21/76885* (2013.01); *H01L 23/5283* (2013.01); *H01L 23/53223* (2013.01); *H01L 23/5329* (2013.01); *H01L 23/53228* (2013.01); *H01L 23/53238* (2013.01); *H01L 23/53266* (2013.01); *H01L 2924/0002* (2013.01)

(58) Field of Classification Search
CPC .............. H01L 23/5226; H01L 23/53223; H01L 23/5283; H01L 21/76855
See application file for complete search history.

(56) References Cited

U.S. PATENT DOCUMENTS

| | | | |
|---|---|---|---|
| 5,323,060 A | 6/1994 | Fogal | |
| 5,619,072 A | 4/1997 | Mehta | |
| 5,925,932 A | 7/1999 | Tran | |
| 6,475,895 B1 | 11/2002 | Mei | |
| 6,576,551 B1 | 6/2003 | Chang | |
| 6,756,660 B2* | 6/2004 | Yasunaga | H01L 23/49541 257/666 |
| 2003/0075752 A1 | 4/2003 | Motoyama | |
| 2009/0166766 A1 | 7/2009 | Lin | |
| 2010/0327422 A1 | 12/2010 | Lee | |
| 2012/0018863 A1 | 1/2012 | Oganesian | |
| 2012/0074578 A1* | 3/2012 | Kobayashi | H01L 24/11 257/773 |
| 2012/0319259 A1 | 12/2012 | Kim | |

* cited by examiner

*Primary Examiner* — Marc Armand
*Assistant Examiner* — Christina Sylvia
(74) *Attorney, Agent, or Firm* — Winston Hsu; Scott Margo

(57) ABSTRACT

A method of fabricating a conductive line of a semiconductor device is disclosed. The method includes the steps of: sequentially forming a conductive material layer and a mask on a semiconductor substrate, wherein a thickness of the conductive material layer is between 30000 angstroms (Å) and 90000 angstrom (Å); performing a first etching process to remove a part of the conductive material layer to form at least an upper side; and performing a second etching process to remove a part of the conductive material layer to form at least a lower side, wherein a curvature of the upper side is different from a curvature of the lower side.

11 Claims, 3 Drawing Sheets

METHOD OF FABRICATING CONDUCTIVE LINE OF A SEMICONDUCTOR DEVICE

CROSS REFERENCE TO RELATED APPLICATIONS

This application is a division of U.S. application Ser. No. 13/570,237 filed Aug. 8, 2012, and incorporated herein by reference in its entirety.

BACKGROUND OF THE INVENTION

1. Field of the Invention

The present invention relates to a conductive line of a semiconductor device and a method of fabricating a conductive line, and more particularly, to a conductive line of a semiconductor device having at least two different values of curvature and a method of fabricating the same.

2. Description of the Prior Art

In the fabrication of semiconductor integrated circuits (ICs), semiconductor devices are generally connected by several metallic interconnecting layers commonly referred to as multi-level interconnects. When the integration of semiconductor devices in the semiconductor integrated circuits increases, improving the process of forming the structure of multi-level interconnects gets more important. The multi-level interconnects usually include dielectric layers and metal layers disposed alternately. The process of manufacturing multi-level interconnects includes the following steps. A patterned conductive layer is formed on a substrate, followed by forming a dielectric layer covering the conductive layer. Subsequently, a plurality of contact plugs electrically connected to the conductive layer is formed in the dielectric layer. Then, another conductive layer electrically connected to the contact plugs is formed on the dielectric layer. After the formation of the conductive and dielectric layers, a passivation layer is finally selectively disposed thereon to complete the formation of the multi-level interconnects.

The dielectric layer and the passivation layer mainly provide insulation and protection functions. For different purposes, some parameters of the dielectric layer and the passivation layer, such as the electric constant, the material strength, and the stress between the materials and other materials in contact with the dielectric layer or the passivation layer, must be considered. Generally, the dielectric layer and the passivation layer are made of silicon oxide or silicon nitride. Since silicon nitride is more rigid, it is therefore mostly selected as a passivation layer in semiconductor devices. The semiconductor processes are various for achieving different requirements; if the thickness of the conductive layer is too large, or the integration of the conductive layer is too high, the dielectric layer or the passivation layer covering the conductive layer may be affected, and the step coverage effect of the dielectric layer or the passivation layer may therefore be deteriorated, overhang may form when the dielectric layer or the passivation layer is used to fill in the space between two conductive layers, cracks in the dielectric layer or the passivation layer may be induced at the corner of the conductive layer due to high stress between the dielectric layer or the passivation layer and the conductive layer.

Consequently, how to prevent the formation of cracks in the dielectric layer or the passivation layer due to the excessive thickness of the conductive layer, so as to improve the performances of the semiconductor device is still an important issue in the field.

SUMMARY OF THE INVENTION

An objective of the present invention is therefore to provide a conductive line of a semiconductor device and a method of fabricating the same to provide a profile of the conductive line which may avoid crack formation in the dielectric layer disposed on the conductive line.

According to one exemplary embodiment of the present invention, a conductive line of a semiconductor device is provided. A conductive layer and a semiconductor substrate are included. The conductive layer is disposed on the semiconductor substrate, and a thickness of the conductive layer is substantially larger than 10000 angstrom (Å). Furthermore, at least a side of the conductive layer has at least two different values of curvature.

According to another exemplary embodiment of the present invention, a method for fabricating a conductive line of a semiconductor device includes the following steps. At first, a conductive material layer and a mask are sequentially formed on a semiconductor substrate, and a thickness of the conductive layer is substantially larger than 10000 angstrom (Å). Subsequently, a first etching process is performed to remove a part of the conductive material layer to form at least an upper side. Then, a second etching process is further performed to remove a part of the conductive material layer to form at least a lower side, and a curvature of the upper side is different form a curvature of the lower side.

The multi-etching processes are performed in the present invention to modify the profile of at least a side of the conductive layer, therefore, at least one side of the formed conductive line could have at least two different values of curvature, and the side of the conductive line may include a concave-curved upper side and a linear lower side. Accordingly, the upper side of the conductive line may provide a concave-curved profile instead of a common vertical profile, and the excess stress may be prevented from being accumulated at the corner of the conductive line when a dielectric layer is disposed to cover the conductive line. Consequently, the crack formation in the dielectric layer can be avoided, the insulation and protection functions of the dielectric layer can be improved, and the performances of the semiconductor device may be enhanced.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
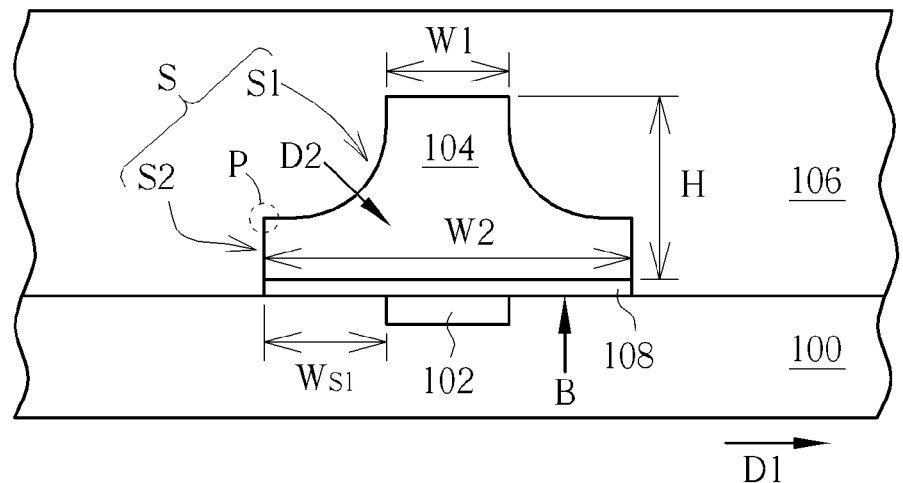
FIG. 1 is a schematic diagram illustrating a conductive line of a semiconductor device according to a preferred exemplary embodiment of the present invention.

Please refer to FIG. 1, which is a schematic diagram illustrating a conductive line of a semiconductor device according to a preferred exemplary embodiment of the present invention. As shown in FIG. 1, a patterned conductive layer 104 is disposed on a semiconductor substrate 100. The semiconductor substrate 100 may be a substrate composed of silicon, gallium arsenide (GaAs), silicon on insulator (SOI) layer, epitaxial layer, SiGe layer or other semiconductor materials. The semiconductor substrate 100 may include a plurality of conductive regions 102 and other semiconductor elements (not shown) disposed therein. The conductive regions 102 could be any kind of conductive elements, including gate electrodes, drain electrodes, source electrodes, contact plugs, via plugs, conductive lines etc., or metal contacts. Furthermore, a material of the conductive region 102 may include doped semiconductor material, metal silicide, or metal. Moreover, the conductive region 102 could also be disposed on the semiconductor substrate 100 or in a dielectric layer (not shown) disposed on the semiconductor substrate 100. The conductive layer 104 made of conductive material is electrically connected to at least one of the illustrated conductive regions 102 and/or at least one of the other semiconductor elements. The material of the conductive layer 104 includes opaque metal such as aluminum (Al), molybdenum (Mo), chromium (Cr), tungsten (W), copper (Cu) or any combination thereof, but not limited thereto, or other proper transparent conductive material, but not limited thereto. In this exemplary embodiment, the conductive layer 104 may serve as interconnect or input/output pad, and be made of aluminum. Furthermore, a thickness H of the conductive layer 104 is substantially larger than 10000 angstrom (Å), and the thickness of the conductive layer 104 is preferably between 30000Å and 90000Å. Additionally, a dielectric layer 106 disposed on the conductive layer 104 may provide insulation properties, or serve as passivation layer. A material of the dielectric layer 106 may include dielectric materials commonly used in a semiconductor manufacturing process, low dielectric constant (low-K) material (K value smaller than 3.9), ultra low-K (ULK) material (K value smaller than 2.6), or porous ULK material, for example silicon oxide or silicon nitride. A barrier layer 108 can be selectively disposed between the conductive layer 104 and the semiconductor substrate 100, which may prevent the metal elements of the conductive layer 104 from diffusing into the conductive regions 102, and the barrier layer 108 includes a single layered structure or a multi-layered structure made of titanium (Ti), titanium nitride (TiN) or other proper materials.

It is appreciated that, at least a side S of the conductive layer 104 has at least two different values of curvature. In other words, the side S of the conductive layer 104 does not include only one line segment, but include several sub sides having different inclination degrees or different shapes. More specifically, the side S of the conductive layer 104 includes at least an upper side S1 and at least a lower side S2, and the upper side S1 is disposed on the lower side S2. A shape of the upper side S1 is different from a shape of the lower side S2, therefore, a twist point P is formed at the boundary of the upper side S1 and the lower side S2, and a curvature of the upper side S1 is substantially larger than a curvature of the lower side S2. In this exemplary embodiment, the curvature of the upper side S1 is substantially around 1, and the curvature of the lower side S2 is substantially around 0, in other words, the shape of the upper side S1 is similar to a quarter circle, i.e. the upper side S1 could be a curved side, and the shape of the lower side S2 is similar to a line segment, i.e. the lower side S2 could be a linear side. Furthermore, the projected length $W_{S1}$ of the upper side S1 along a horizontal direction D1 on a bottom B of the conductive layer 104 is substantially larger than the projected length of the lower side S2 along the horizontal direction D1 on the bottom B of the conductive layer 104 (as the lower side S2 is a linear side, the projected length is substantially around 0). The upper side S1 is preferably a concave-curved side, in other words, the upper side S1 is a curved side having a curved direction D2 toward the semiconductor substrate 100.

In addition, a width W1 of a top of the conductive layer 104 is substantially smaller than a width W2 of a bottom of the conductive layer 104, and the width W1 of the top of the conductive layer 104 is preferably substantially larger than or equal to one third of the width W2 of the bottom of the conductive layer 104. In this exemplary embodiment, the width W1 of the top of the conductive layer 104 is substantially around 40000 Å, the width W2 of the bottom of the conductive layer 104 is substantially around 120000 Å, and the thickness H of the conductive layer 104 is substantially around 60000 Å, i.e. the ratio of the thickness H to the maximum width of the conductive layer 104 is substantially around 0.5. The part where the side S of the conductive layer 104 contacts the dielectric layer 106 has a half-Y shaped profile, in other words, the side S of the conductive layer 104 provides a concave-curved profile instead of a common vertical profile, therefore, the excess stress may be prevented from being accumulated at the corner of the conductive layer 104 which would induce crack formation in the dielectric layer 106 covering the conductive layer 104.

Figure 2:
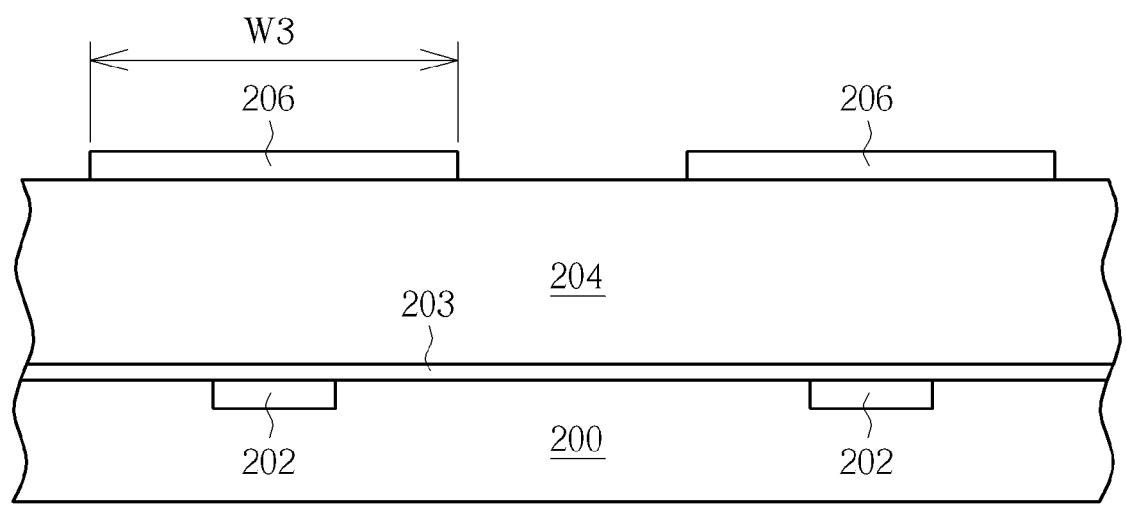
FIG. 2 through FIG. 6 are schematic diagrams illustrating a method of fabricating a conductive line of a semiconductor device according to a preferred exemplary embodiment of the present invention.

The present invention provides a method for fabricating a conductive line of a semiconductor device as illustrated above. Please refer to FIG. 2 through FIG. 6, which are schematic diagrams illustrating a method for fabricating a conductive line of a semiconductor device according to a preferred exemplary embodiment of the present invention. As shown in FIG. 2, at first, a semiconductor substrate 200 is provided. The semiconductor substrate 200 may include a plurality of conductive regions 202 and/or other semiconductor elements (not shown) disposed therein. Furthermore, the semiconductor substrate 200 may be a substrate composed of silicon, gallium arsenide (GaAs), silicon on insulator (SOI) layer, epitaxial layer, SiGe layer or other semiconductor materials. The conductive regions 202 could be any kind of conductive elements, including gate electrodes, drain electrodes, source electrodes, contact plugs, via plugs, conductive lines etc., or metal contacts, as illustrated as the conductive regions 102 of FIG. 1. The methods of forming the conductive regions 202 and other semiconductor elements are known to those skilled in the art, so the details are omitted herein for brevity.

Subsequently, a barrier layer 203, a conductive material layer 204 and a mask 206 are sequentially formed on the semiconductor substrate 200. The barrier layer 203 includes a single layered structure or a multi-layered structure made of titanium (Ti), titanium nitride (TiN) or other proper materials, and the barrier layer 203 can be formed through sputtering process or other thin-film deposition process. The conductive material layer 204 could be made of conductive material including opaque metal such as aluminum (Al), molybdenum (Mo), chromium (Cr), tungsten (W), copper (Cu) or any combination thereof, but not limited thereto, or other proper transparent conductive material. The conductive material layer 204 having a thickness substantially larger than 10000 Å could be conformally formed on the semiconductor substrate 200 through a physical vapor deposition (PVD) process, such as sputtering process and evaporation process, chemical vapor deposition (CVD) process, or other thin-film deposition process, and the thickness of the conductive material layer 204 is preferably between 30000 Å and 90000 Å. In this exemplary embodiment, the conductive material layer 204 is made of aluminum, and the thickness of the conductive material layer 204 is substantially around 60000 Å. Moreover, the mask 206 could be a patterned photoresist layer or a hard mask including a single layered structure made of proper material or a multi-layered structure made of at least two of other proper materials. The methods of forming the mask 206 are known to those skilled in the art, so the details are omitted herein for brevity. In this exemplary embodiment, a width W3 of the mask 206 is substantially around 120000 Å.

Figure 3:
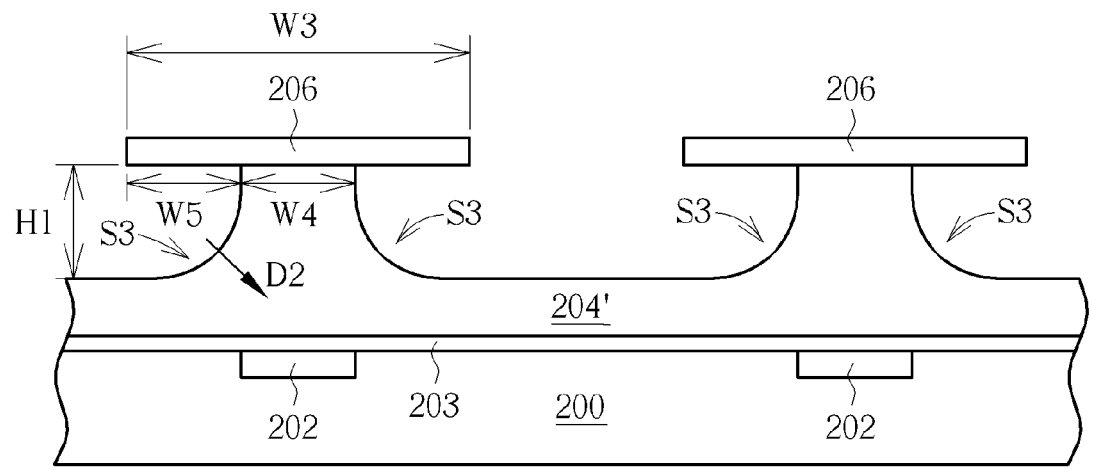

As shown in FIG. 3, the mask 206 could serve as a patterned mask, and a first etching process is performed to remove a part of the conductive material layer 204 to form at least an upper side S3. Furthermore, a part of the remained conductive material layer 204' may still be exposed by the mask 206, and the first etching process could be an isotropic etching process. The thickness of the removed part of the conductive material layer 204 can be modulated by a time mode, for example by adjusting the process conditions such as the processing time of the first etching process, so that the conductive material layer 204 can be partially removed without being penetrated through. In this exemplary embodiment, the first etching process may be a wet etching process, and the etchant may preferably be a solution including nitric acid, phosphoric acid and acetic acid mixed in an adequate ratio. The remained conductive material layer 204' remains on the semiconductor substrate 200 that is not overlapped by the mask 206, so that the semiconductor substrate 200 not overlapped by the mask 206 is still not exposed.

It is appreciated that, the first etching process could be an isotropic etching process, therefore, in addition to the conductive material layer 204 not covered by the mask 206 that is removed, a part of the conductive material layer 204 covered by the mask 206 may also be removed due to lateral etching. Accordingly, after the implementation of the first etching process, a width W4 of a top of the remained conductive material layer 204' may be substantially smaller than the width W3 of the mask 206, and the curved upper sides S3 are formed between the mask 206 and the semiconductor substrate 200 overlapped by the mask 206. In this exemplary embodiment, after the first etching process and before the later performed second etching process, a width W5 and a thickness H1 of the removed conductive material layer under the mask 206 are equal, the width W5 of the removed conductive material layer is one third of the width W3 of the mask 206, and the thickness H1 of the removed conductive material layer is two third of the original thickness of the conductive material layer 204. In other words, when the width W3 of the mask 206 is substantially around 120000 Å and the original thickness of the conductive material layer 204 is substantially around 60000 Å, the width W5 of the removed conductive material layer and the width W4 of the top of the remained conductive material layer 204' are equal and substantially around 40000 Å, and the thickness H1 of the removed conductive material layer is substantially around 40000 Å as well. Furthermore, a curvature of the formed upper side S3 is substantially around 1, i.e. the shape of the upper side S3 is similar to a quarter circle, and the center of the circle is outside the remained conductive material layer 204'. Accordingly, the upper side S3 has a curved direction D3 toward the semiconductor substrate 200, but not limited thereto. The upper side S3 may have a different curvature, and the thickness ratio/width ratio of the removed conductive material layer to the remained conductive material layer maybe modified, according to the process requirements.

Figure 4:
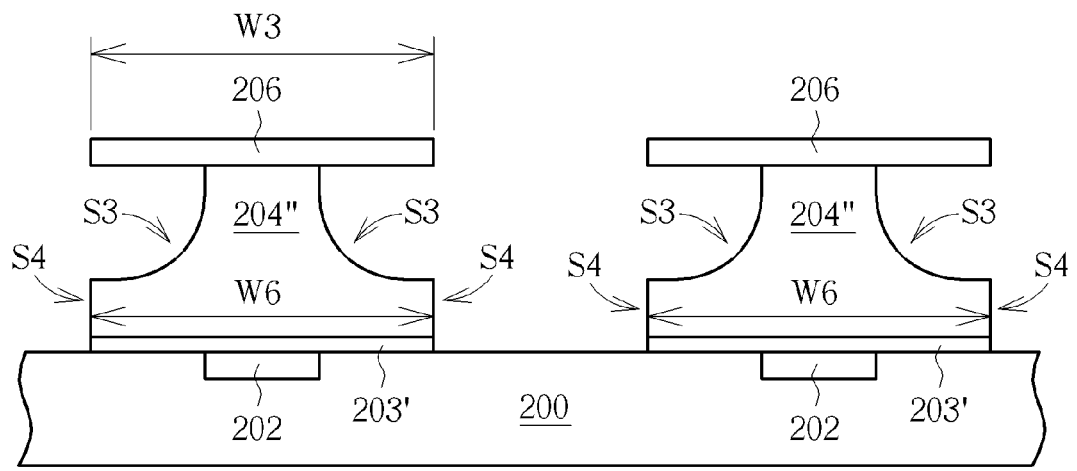
Figure 5:
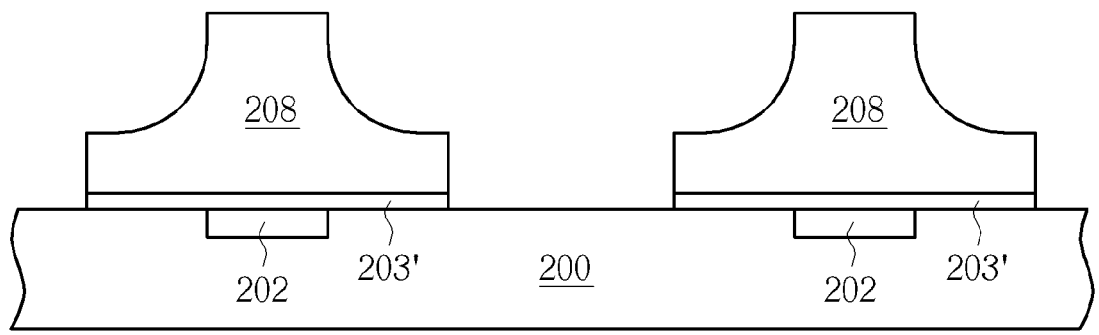

Afterwards, as shown in FIG. 4, after the first etching process, a second etching process is performed to further remove a part of the barrier layer 203, a part of the remained conductive material layer 204' to form at least a lower side S4. It is preferable that the barrier layer 203 exposed by the mask 206 and the remained conductive material layer 204' exposed by the mask 206 are totally removed. The second etching process different from the first etching process could be an anisotropic etching process, so that a curvature of the formed lower side S4 is different from the curvature of the upper side S3. Furthermore, the second etching process could be performed under the end point mode, or the etching process could be stopped when the semiconductor substrate 200 under the remained conductive material layer 204' is exposed or when an etching stop layer disposed between the remained conductive material layer 204' and the semiconductor substrate 200 is exposed, in order to achieve the better etching effect. In this exemplary embodiment, the second etching process may be a dry etching process, and the etchant may preferably be a mixed gas including chlorine ($Cl_2$) and boron trichloride ($BCl_3$) in an adequate ratio. The implementation of the second etching process may totally remove the barrier layer 203 exposed by the mask 206 and the remained conductive material layer 204' exposed by the mask 206 along a vertical direction. Then, as shown in FIG. 5, the mask 206 is removed and a cleaning process is selectively performed to complete the formation of at least a conductive line 208 of a semiconductor device. The conductive lines 208 could be electrically connected to at least one of the conductive regions 202 and/or at least one of other semiconductor elements. Moreover, the number and the relative position of the conductive lines are not limited thereto.

Figure 6:
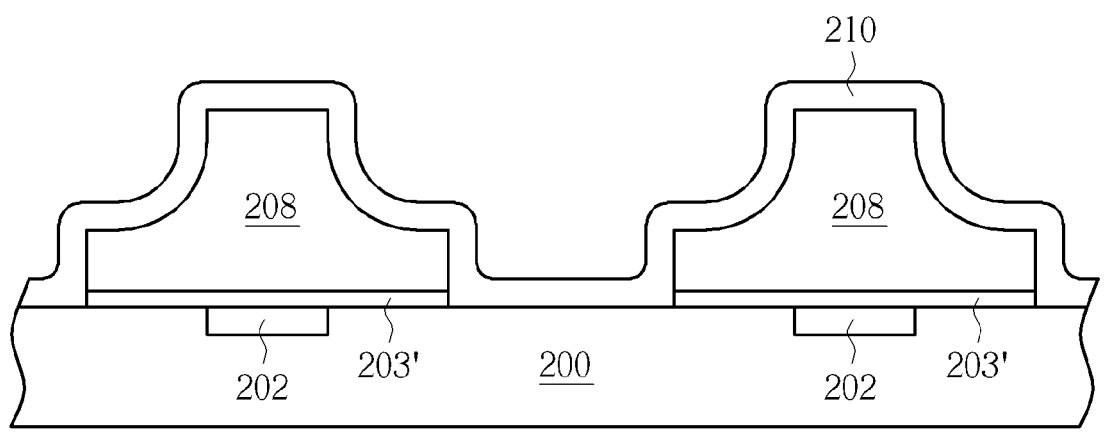

As shown in FIG. 6, a dielectric layer 210 could be further formed on the conductive lines 208. The upper side S3 of the conductive line 208 may provide a concave-curved profile instead of a common vertical profile, therefore, no excess stress may accumulate at the corner of each of the conductive lines 208 when the dielectric layer 210 covers the conductive lines 208. Consequently, cracks in the dielectric layer 210 can be avoided.

It is appreciated that, the second etching process could be an anisotropic etching process, and only the remained conductive material layer 204' not covered by the mask 206 may be removed. Accordingly, after the implementation of the second etching process, a width WE of a bottom of the remained conductive material layer 204" is substantially equal to the width W3 of the mask 206, and the linear lower sides S4 are formed between the mask 206 and the semiconductor substrate 200 overlapped by the mask 206. Furthermore, a width of the remained barrier layer 203' is substantially equal to the width W3 of the mask 206 as well. Because the process characteristics of the first etching process are different from that of the second etching process, the curvature of the formed upper side S3 could be modulated to be substantially larger than the curvature of the formed lower side S4. In this exemplary embodiment, after the second etching process, the width WE of the bottom of the remained conductive material layer 204" is substantially around 120000 Å, and a width of a top of the conductive line 208 (the width W4 of the top of the remained conductive material layer 204') is substantially smaller than a width of a bottom of the conductive line 208 (the width WE of the bottom of the remained conductive material layer 204"), and the top of the conductive line 208 does not totally overlap the bottom of the conductive line 208. Additionally, the shape of the lower side S4 is similar to a line segment, i.e. the curvature of the lower side S4 is substantially around 0, but not limited there to.

In conclusion, the multi-etching processes are performed in the present invention to modify the profile of at least a side of the conductive layer, therefore, at least one side of the formed conductive line could have at least two values of curvature, and the side of the conductive line may include a concave-curved upper side and a linear lower side. Accordingly, the upper side of the conductive line may provide a concave-curved profile instead of a common vertical profile, and the excess stress may be prevented from being accumulated at the corner of the conductive line when a dielectric layer is disposed to cover the conductive line. Consequently, cracks in the dielectric layer can be avoided, the insulation and protection functions of the dielectric layer can be improved, and the performances of the semiconductor device are enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a conductive line of a semiconductor device, comprising:
   sequentially forming a conductive material layer and a mask on a semiconductor substrate, wherein a thickness of the conductive material layer is between 30000 angstroms (Å) and 90000 angstrom (Å);
   performing a first etching process to remove a part of the conductive material layer to form at least an upper side; and
   performing a second etching process to remove a part of the conductive material layer to format least a lower side, wherein a curvature of the upper side is different from a curvature of the lower side.

2. The method of fabricating a conductive line of a semiconductor device according to claim 1, wherein the first etching process comprises an isotropic etching process, and the second etching process comprises an anisotropic etching process.

3. The method of fabricating a conductive line of a semiconductor device according to claim 1, wherein the second etching process is performed after the first etching process.

4. The method of fabricating a conductive line of a semiconductor device according to claim 1, wherein the curvature of the upper side is substantially larger than the curvature of the lower side.

5. The method of fabricating a conductive line of a semiconductor device according to claim 1, wherein the curvature of the upper side is substantially around 1, and the curvature of the lower side is substantially around 0.

6. The method of fabricating a conductive line of a semiconductor device according to claim 1, wherein the upper side comprises a concave-curved side, and the lower side comprises a linear side.

7. The method of fabricating a conductive line of a semiconductor device according to claim 1, wherein a width of a top of the conductive material layer is substantially smaller than a width of the mask after the implementation of the first etching process.

8. The method of fabricating a conductive line of a semiconductor device according to claim 1, wherein a width of a bottom of the conductive material layer is substantially equal to a width of the mask after the implementation of the second etching process.

9. The method of fabricating a conductive line of a semiconductor device according to claim 1, wherein a material of the conductive layer comprises aluminum (Al).

10. The method of fabricating a conductive line of a semiconductor device according to claim 1, further comprising forming a barrier layer between the conductive layer and the semiconductor substrate.

11. The method of fabricating a conductive line of a semiconductor device according to claim 10, further comprising performing the second etching process to remove a part of the barrier layer.

* * * * *